(12) United States Patent  
Wallace

(10) Patent No.: US 6,556,062 B1  
(45) Date of Patent: Apr. 29, 2003

(54) GATE DRIVE FOR INSULATED GATE POWER SEMICONDUCTORS

(75) Inventor: Gregory Craig Wallace, Christchurch (NZ)

(73) Assignee: South Island Discretes Limited, Central (HK)

( * ) Notice: Subject to any disclaimer, the term of this patent is extended or adjusted under 35 U.S.C. 154(b) by 0 days.

(21) Appl. No.: 09/719,509

(22) PCT Filed: Jun. 11, 1999

(86) PCT No.: PCT/NZ99/00082

§ 371 (c)(1),  
(2), (4) Date: Dec. 12, 2000

(87) PCT Pub. No.: WO99/65144

PCT Pub. Date: Dec. 16, 1999

(30) Foreign Application Priority Data

Jun. 12, 1998 (NZ) .................................. 330687

(51) Int. Cl.[7] ............................................. H03K 17/687
(52) U.S. Cl. ...................................... 327/434; 327/132
(58) Field of Search ................................ 327/434, 376, 327/377, 380, 381, 389, 103, 108, 170, 112, 109–111, 132, 134, 137; 323/312, 243, 280; 326/82, 83

(56) References Cited

U.S. PATENT DOCUMENTS

| | | | | |
|---|---|---|---|---|
| 5,055,721 A | * | 10/1991 | Majumdar et al. | 327/434 |
| 5,157,351 A |   | 10/1992 | Carobolante | 330/277 |
| 5,381,082 A | * | 1/1995  | Schlicht | 323/280 |
| 5,469,094 A | * | 11/1995 | Nessi | 327/108 |
| 5,469,096 A | * | 11/1995 | Nessi et al. | 327/112 |
| 5,656,969 A |   | 8/1997  | Pulvirenti | 327/108 |
| 5,742,193 A | * | 4/1998  | Colli et al. | 327/377 |
| 5,825,218 A | * | 10/1998 | Colli et al. | 327/377 |
| 5,825,234 A | * | 10/1998 | Sung et al. | 327/434 |
| 5,828,245 A | * | 10/1998 | Brambilla et al. | 327/108 |
| 5,939,909 A | * | 8/1999  | Callahan, Jr. | 327/170 |
| 6,133,766 A | * | 10/2000 | Pulvirenti et al. | 327/103 |
| 6,144,374 A | * | 11/2000 | Hyun | 327/103 |

* cited by examiner

Primary Examiner—Terry D. Cunningham  
Assistant Examiner—Long Nguyen  
(74) Attorney, Agent, or Firm—Fulbright & Jaworski LLP

(57) ABSTRACT

A method of control of the current and voltage switching trajectories of insulated gate power semiconductor switches, more specifically MOSFETs and insulated gate bipolar transistor devices (IGBTs), is disclosed. MOSFETs and IGBTs are used in switch mode power supplies because of their easy driving ability and their ability to handle high currents and voltages at high-switching frequencies. However, the switching trajectories for both types of devices are responsible for both common-mode electromagnetic emissions generated by the drain current waveform and power losses in the commutation cell. These two characteristics represent opposing design objectives for power converters. The current invention uses a hybrid voltage/current gate signal source with feedback of the gate charge (or discharge) current to dynamically and independently control the drain current and drain voltage of an insulated semiconductor device. The rate of change of drain current is controlled by the voltage source traversing the transconductance curve while the rate of change of the drain voltage is controlled by dynamic variations in the current source due to feedback.

24 Claims, 7 Drawing Sheets

GATE DRIVE FOR INSULATED GATE POWER SEMICONDUCTORS

TECHNICAL FIELD

The present invention relates to an analogue gate drive for insulated gate power semiconductors. More specifically it relates to control of the current and voltage switching trajectories of insulated gate power semiconductor switches, which has application in the area of fundamental power electronics.

BACKGROUND ART

MOSFETs and insulated gate bipolar transistor devices (IGBTs) are used in switch mode power supplies (SMPS) because of their easy driving ability and their ability to handle high currents and voltages at high-switching frequencies.

However, the switching trajectories for both types of devices are responsible for both common-mode electromagnetic emissions generated by the drain current waveform and power losses in the commutation cell. These two characteristics represent opposing design objectives for power converters. As requirements of miniaturisation drive the switching frequencies higher, a satisfactory trade off between electromagnetic interference (EMI) and power losses becomes increasingly difficult.

The characteristic rectangular voltage waveform of SMPS is modelled as a periodic trapezoidal pulse train. This waveform produces E-field radiation and common mode conducted interference which is caused by parasitic capacitances to ground returns.

Electrostatic screening (of known type) and circuit references (Zverev et al, Proc. IEEE PESC '97, Missouri, USA) can be used to minimise the effects of electromagnetic field and any induced common mode coupling. However the similarity of the rectangular switching currents in the commutation circuitry produces significant changing magnetic flux. This induces high frequency noise throughout the circuit, resulting in H-field radiation and interference with harmonics, which can extend beyond 100 Mhz.

An additional constraint on any design or modification is that the device must still be electromagnetically compatible (EMC) (that is, complying with all applicable standards, for example the European CISPR recommendations).

Also, in the avoidance of the problems associated with EMC, magnetic material for shielding, such as steel, can be used. However the performance of such shields drops off sharply above 500 KHz.

Improvement methods for power converters that are EMC fall into three classes. Firstly, there are methods of containment and dissipation, such as shielding. Secondly, parasitic components contributing to EMI can be minimised. An example of such a method is to minimise the current loop area through decoupling and layout.

Thirdly are methods that allow for the reduction of EMI generated at the commutation source. Such methods can be effective but can add significant complexity to the design of any device. For example, soft switching resonant and quasi-resonant topologies can be used.

However, the drawback of such a method is the higher conduction loss, higher voltage stress and more numerous or larger componentry.

A further example of these third methods is one that slows the current rise and fall times with the addition of gate resistors. However the disadvantage is that the gate resistor limits the amount of current available to charge the parasitic gate-drain capacitance (Miller capacitance) as the drain voltage changes. This leads to slow voltage switching times.

However the trade off between EMI and power loss is becoming increasingly difficult as switching frequencies move higher.

An alternative approach is to eliminate or reduce EMI generation at its source. One possible solution is that disclosed by Consoli et al ("An innovative EMI reduction design technique in Power Converters", IEEE Trans. On Electromagnetic Compatibility, Vol 38, No. 4, November 96) and by Musumeci et al ("Switching-behaviour Improvement of Insulated Gate-Controlled Devices", IEEE Trans. On power electronics, Vol. 12, No. 4, July 1997). The solution proposed by both is an EMI reduction technique based on a digital method, using carefully timed current sources to overcome the miller capacitance effect during switching.

An object of the present invention is the provision of an analogue gate drive technique which allows the independent and optimal control of the drain current and voltage waveforms in switched mode converters using insulated gate power devices.

A further object of the present invention is the provision of a gate drive technique which overcomes or at least mitigates some of the abovementioned disadvantages, or at least provides the public with a useful choice.

DISCLOSURE OF INVENTION

According to a first aspect of the invention there is provided a circuit for independent control of drain current and voltage for an insulated gate switching circuit, for a switching mode power supply, said circuit including:

an insulated gate semi-conductor device;

a linear buffer; and a combined voltage source and current source within a local feedback loop operable during turn-off; wherein the rate of change of current is controlled by the gate voltage traversing the transconductance curve.

According to a second aspect of the invention there is provided a gate drive circuit for an insulated gate semiconductor device including:

a voltage source;

a current source; and a feedback signal, wherein a combination of the voltage source and current source are adapted to provide a gate signal for an insulated gate semiconductor device, such that the gate signal allows independent control of drain current and drain voltage during the turn-on or turn-off of said insulated gate semiconductor.

Preferably the feedback signal is the gate charge (or discharge) current of an insulated gate semiconductor.

Preferably the voltage and current components of the gate signal are adapted to be co-dependent depending on the feedback signal.

Preferably the gate signal output is a linear buffer having a low impedance output and in particular the linear buffer is an operational amplifier of similar.

Preferably the voltage source and current source may be a combined voltage and current source having a low output impedance.

Preferably the voltage source and current source are adapted to provide either current control or voltage control of the driving signal depending upon the state of the feedback signal.

Preferably the rate of change of drain current is controlled by the voltage source traversing a transconductance curve of an insulated gate semiconductor.

Preferably the rate of change of the drain voltage is controlled by dynamic variations in the current source due to feedback.

Preferably the gate signal is the gate signal of either a MOSFET or an IGBT.

According to another aspect of the present invention there is provided a circuit for independent control of drain current and voltage for an insulated gate switching circuit, for a switching mode power supply, said circuit including:

a low impedance controlled ramp voltage source, to control the drain voltage slope and drain current slope during switching;

a low impedance voltage linear buffer with a ramp function as its input; wherein both the voltage source and the linear buffer are operable during turn-on, wherein the rate of change of the voltage is limited by the output impedance of the buffer.

Preferably the rate of change of drain current is controlled by the voltage source traversing a transconductance curve of an insulated gate semiconductor.

Preferably the gate signal is the gate signal of either a MOSFET or an IGBT.

BRIEF DESCRIPTION OF DRAWINGS

By way of example only, a preferred embodiment of the present invention is described in detail with reference to the accompanying drawings, in which:

FIG. 5b: is a graphic representation of the drain voltage, gate voltage and drain current waveforms for the circuits of the present invention during turn-on;

BEST MODE FOR CARRYING OUT THE INVENTION

Figure 1:
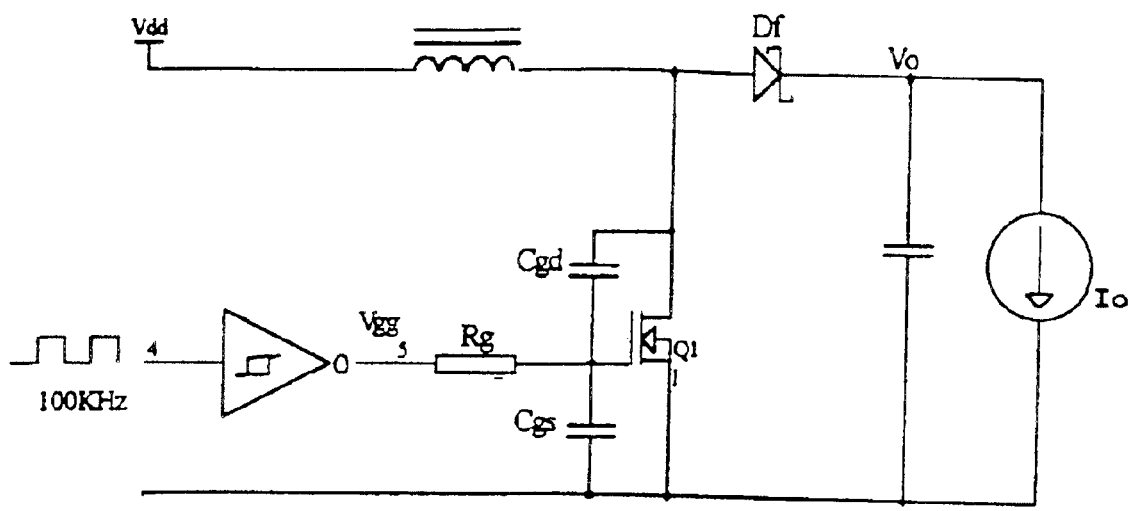
FIG. 1: is a circuit diagram including a known MOSFET gate drive circuit.

It is useful to review the switching characteristics for insulated gate devices and the effect of the traditional gate resistance. The more general case for the MOSFET will be used. Referring to FIG. 1, a conventional MOSFET gate drive circuit 2 is thereshown. Parasitic capacitances Cgd and Cgs are shown for illustrative purposes only and are not circuit components. The circuit includes a high performance digital buffer with a series gate resistor Rg to control the drain current rise and fall times.

Figure 2:
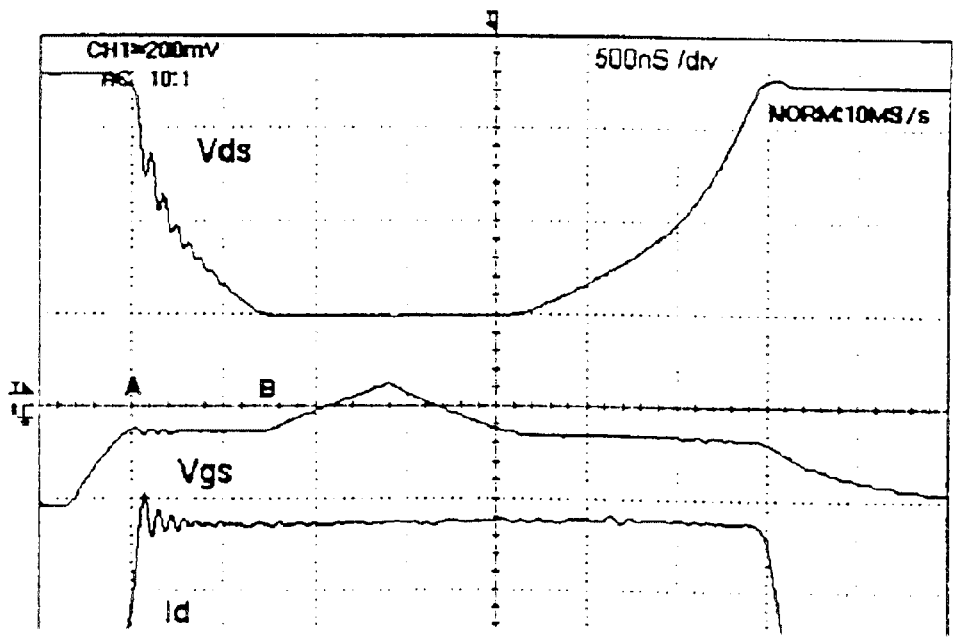
FIG. 2: is a graph showing the waveforms of the circuit of FIG. 1.

FIG. 2 shows the oscilloscope waveforms from the circuit of FIG. 1. The switching frequency used is 100 KHz, with voltage waveforms of 5V/div and current waveforms of 1A/div. Initially the gate-source voltage Vgs rises exponentially until it reaches the threshold voltage and the device starts turning on. The drain current Id begins to rise following the MOSFET transconductance curve. The drain-source voltage Vds remains clamped at its initial value Vo as long as the drain current Id is less than full load current Io and free wheeling diode Df is conducting.

Once the MOSFET is carrying the full load current Io, but is still in the active region, the gate-source voltage Vgs remains constant even thought the gate circuit may be supplying current to the gate. This is due to the drain voltage Vds beginning to decrease requiring discharge of the gate-drain capacitance Cdg through Rg thereby limiting the rate of change of the drain voltage ($dV_{ds}/dt$). This is known as the miller effect, and the region between A and B on FIG. 2 represents the Miller effect zone. The decrease in drain voltage Vds is non-linear and is caused by dynamic variation of the gate-drain capacitance Cgd as the drain-source voltage Vds changes. Thus Rg limits both $dI_d/dt$ and $dV_{ds}/dt$ thereby requiring a trade-off between reduced EMI and power loss. Once the miller effect ends, the gate voltage Vgs can continue to increase to its final value. As can be seen from FIG. 2 the above is also the case during the turn-off phase, except that current is being extracted from the gate capacitance and the order of current and voltage are reversed.

Figure 3:
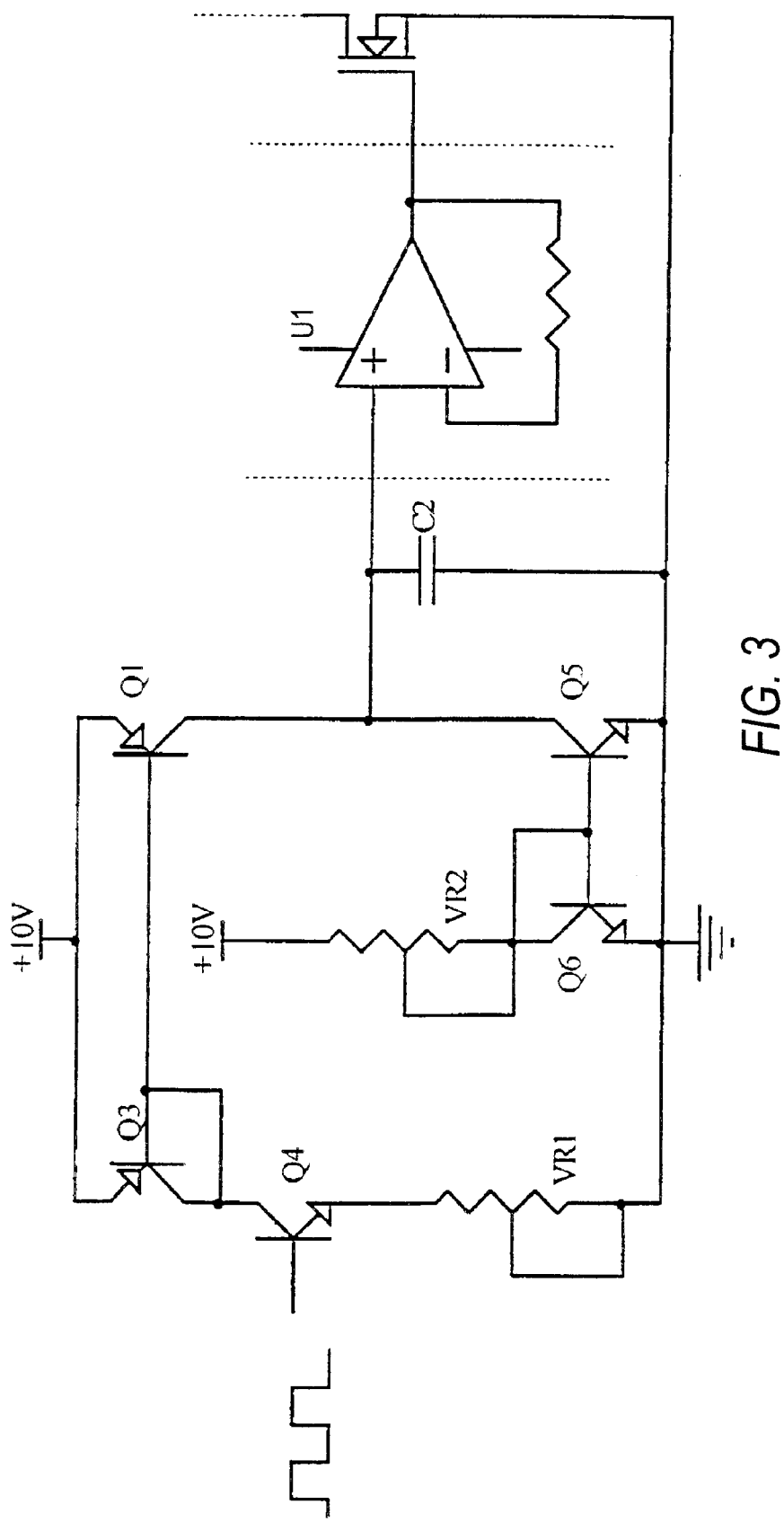
FIG. 3: is a diagrammatic representation of a first preferred embodiment of a turn-on circuit of the present invention.

Referring to FIG. 3 a schematic of the circuit of a first preferred embodiment is thereshown. A digital input signal switches transistor Q4 which controls the two current sources including transistors Q1, Q3, Q5 and Q6. The current sources charge and discharge capacitor C2 so that a ramp signal appears at the input to the linear buffer U1. Variable resistors VR1 and VR2 control the rise and fall times respectively. The linear buffer U1 is a high speed bipolar buffer of known type. An example of such a buffer is the buffer EL2009C (of Elantec Inc).

During switching, the standard gate resistor Rg (shown in FIG. 1), combined with gate source capacitance Cgs, causes a voltage ramp at the MOSFET gate, which controls the drain current Id rate of change. In the standard circuit of FIG. 1, gate resister Rg also limits the current available to charge and discharge the MOSFET gate-drain capacitance Cgd. In the embodiment shown in FIG. 3, control of both the drain current Id slope and drain voltage Vds slope (shown in FIG. 2) are optimised using a low impedance voltage source, making it is possible to remove the gate resistor Rg altogether. This low impedance voltage source can be achieved with the use of a low impedance linear buffer U1 with a ramp function as its input. In this way, the di/dt slope is controlled by the gate voltage Vgs traversing the MOSFET transconductance curve, and dv/dt is limited only by the output impedance of the buffer U1, minimising both H-field emissions and power loss. Using this method the Miller zone in the gate switching trajectory of FIG. 2 is all but eliminated.

Unfortunately this simple circuit has a problem during turn-off, resulting in insufficient control of the drain di/dt (off). A more complex hybrid source involving feedback of the gate current overcomes this problem, and introduces the additional ability to directly control the drain voltage Vds rise and fall times (rather than automatically as fast as the output impedance of the buffer will allow).

Figure 4:
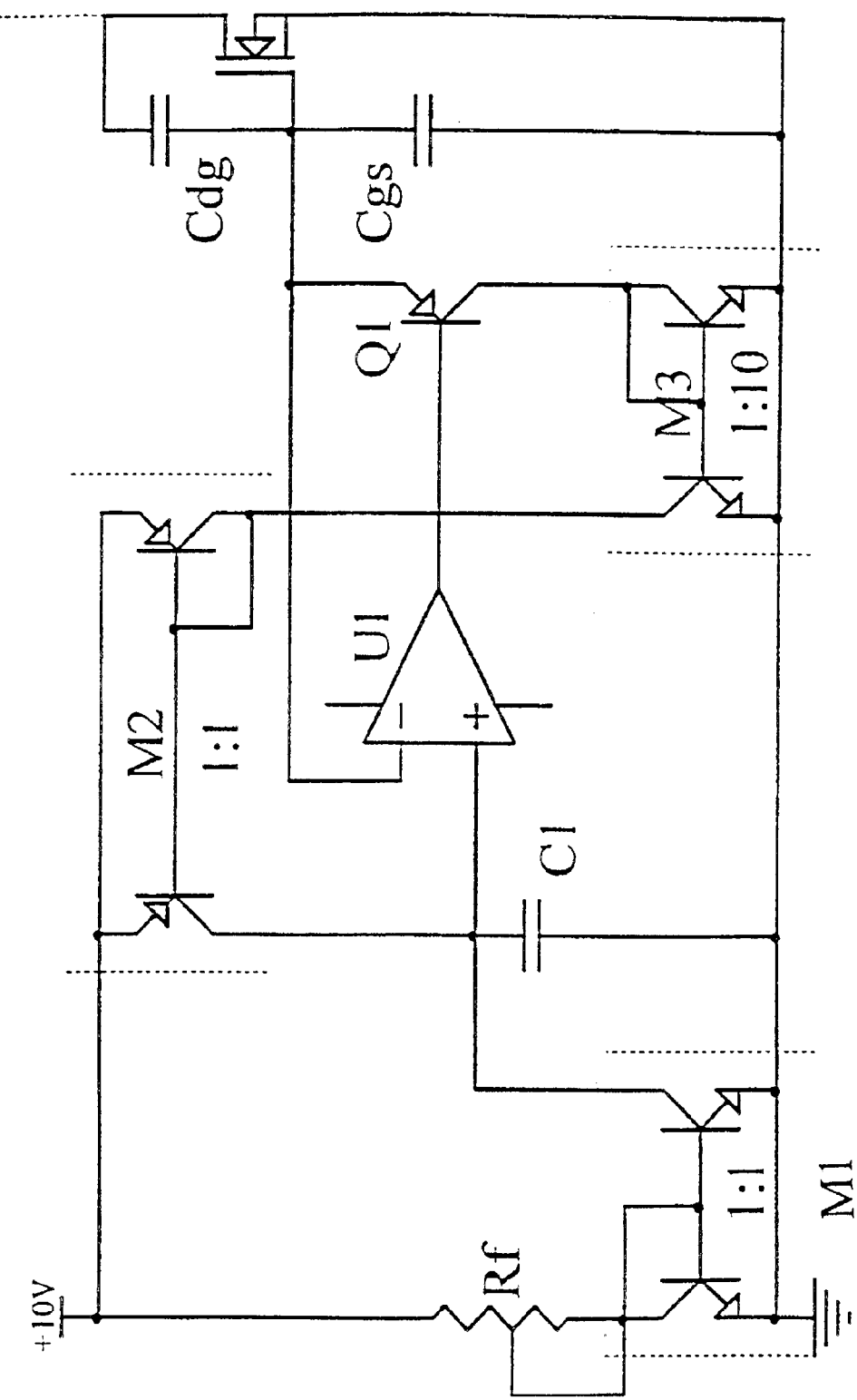
FIG. 4: is a diagrammatic representation of a first preferred embodiment of a turn-off circuit.

Referring to FIG. 4 a preferred embodiment of the turn-off portion of a gate drive circuit utilising feedback of gate current, as described above, is thereshown. This includes a combination voltage source and current source within a local feedback loop. The operation of this circuit will now be explained, but for simplicity, only the case for turn-off only will be described. For the MOSFET this description is the direct inverse of the turn-on phase. For the purpose of this explanation we will assume that C1=Cgs and that the nominal Cgs discharge current is 0.1A.

Rf sets the discharge current for capacitor C1, which is initially charged to the normal on state gate voltage Vgs(on). This creates a voltage ramp on capacitor C1 and gate-source capacitance Cgs due to the operation of the unity gain buffer U1 in conjunction with the emitter follower Q1. Buffer U1 eliminates the base-emitter voltage drop that would normally occur across emitter-follower Q1. This has significance during the current rise-time interval described shortly. Emitter-follower Q1 provides current gain isolating capacitor C1 from gate source capacitance Cgs. During this time current mirror M3, which has a 10:1 reduction characteristic, injects 0.01 amps into capacitor C1 through current mirror M2. This negative feedback results in stabilisation of the current discharge to just under 0.1 amp.

When the voltage ramp reaches on state gate voltage, the drain voltage will start to rise, requiring the gate voltage to plateau as the discharged current is diverted to drain gate capacitance Cdg. This voltage plateau results from the operation of current mirrors M3 and M2. The drain gate capacitance Cdg discharge current through emitter follower Q1 quickly increases until it reaches 1 amp at which time current mirrors M3 and M2 will be injecting 0.1 amps into capacitor C1.

As this injected current is equal to the discharge current set by current mirror M1, the voltage on capacitor C1 will be static, thereby allowing a voltage plateau.

Buffer U1 provides internal gain to eliminate the slight increase in base emitter voltage required to increase the collector current in emitter follower Q1 from 0.1 amps to 1.0 amp. At the end of the Miller region drain gate capacitance Cdg is fully charged and the discharged current is transferred back to gate source capacitance Cgs, resuming the ramp on the gate source voltage. The discharge current drops back to 0.1 amp virtually instantaneously as attempts to discharge the gate source capacitor Cgs faster than capacitor C1 turns off emitter follower Q1.

The circuit is thus self-regulating and the gate voltage is controlled in the pre-determined manner. Consequently the drain current falls at the programmed rate. The current ratio at current mirror M3 can be set to a pre-determined (high) value for the described improvements in the voltage rise-time during turn-off, without affecting the drain current slope.

Figure 7:
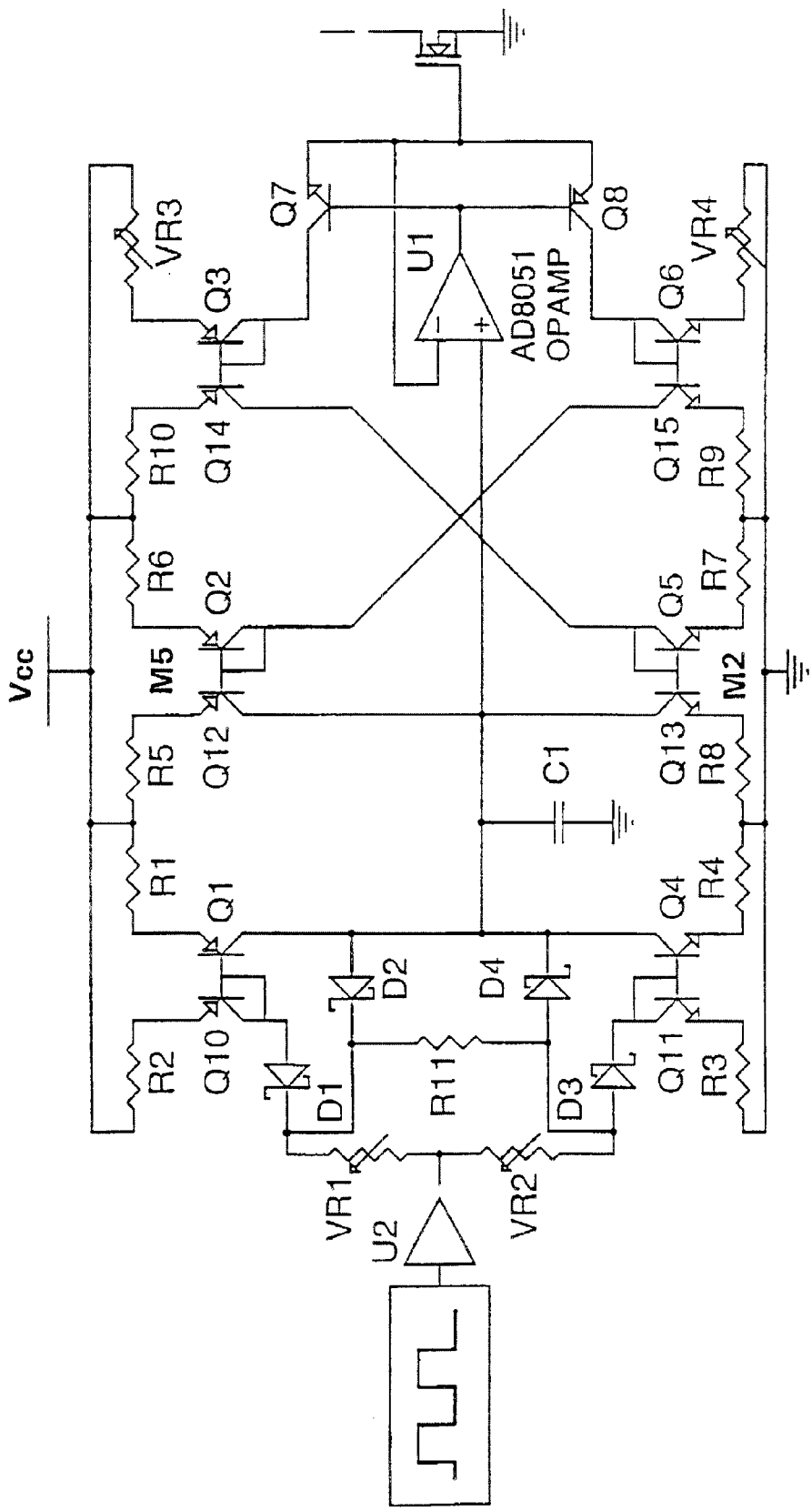
FIG. 7: is a circuit diagram of a full gate drive circuit for both the turn-on and turn-off phases of a semiconductor switching cycle.

As described, earlier the embodiment shown in FIG. 4 is only the turn-off portion of the circuit. Obviously for practical implementation the improved gate drive preferably exhibits improvements to both turn-on and turn-off the semiconductor switch. An embodiment of the invention which provides a improvement to both the turn-on and turn-off portions of the switching cycle is shown in FIG. 7. This circuit has the same operation of that shown in FIG. 4, except with the inclusion of mirror componentry for operation in the turn-on phase of the switching cycle. Current mirrors M2 and M5 have been added to provide for the gate current inversion which occurs between the turn-on and turn-off phases. Parasitic capacitances Cdg and Cgs are not shown in FIG. 7.

The representations shown in FIG. 7 of the invention provide a mechanism to independently and continuously control the slope of both the drain voltage and drain current waveforms during both the turn-on and turn-off processes of insulating gate power devices. This allows very large concurrent improvements in both switching losses and EMI. The four parameters of turn-on current, turn-off current, turn-on voltage and turn-off voltage can be easily and individually controlled through the use of variable resistors VR1, VR2, VR3 and VR4 (as shown on FIGS. 7 and 8) respectively. The drain current control could alternatively be controlled by indirectly changing the value of the current sources through variable voltages.

However, independent of the embodiment of the control of these parameters, it is possible to have all four parameters mentioned above indirectly under software or firmware control from a micro-controller or similar present in the same circuit. This would allow finalisation of parameters as firmware is downloaded during manufacture; for architectural re-use in different models; or finalisation of the PCA layout etc prior to achieving finalisation of the requirements for EMC compliance. Extending this concept will allow control, using standard communication methods, of the four gate drive parameters mentioned remotely from a suitable general computer device such as a laptop PC. This would make it possible to adjust all four parameters remotely as required during EMC compliance testing in order to investigate and store information relevant to achieving EMC compliance without undue penalty. Further, such a system would allow the standard gate drive module to be used in a range of switching circuits where the required parameters for each circuit were uploaded, either by firmware or software, at the time of testing.

Figure 8:
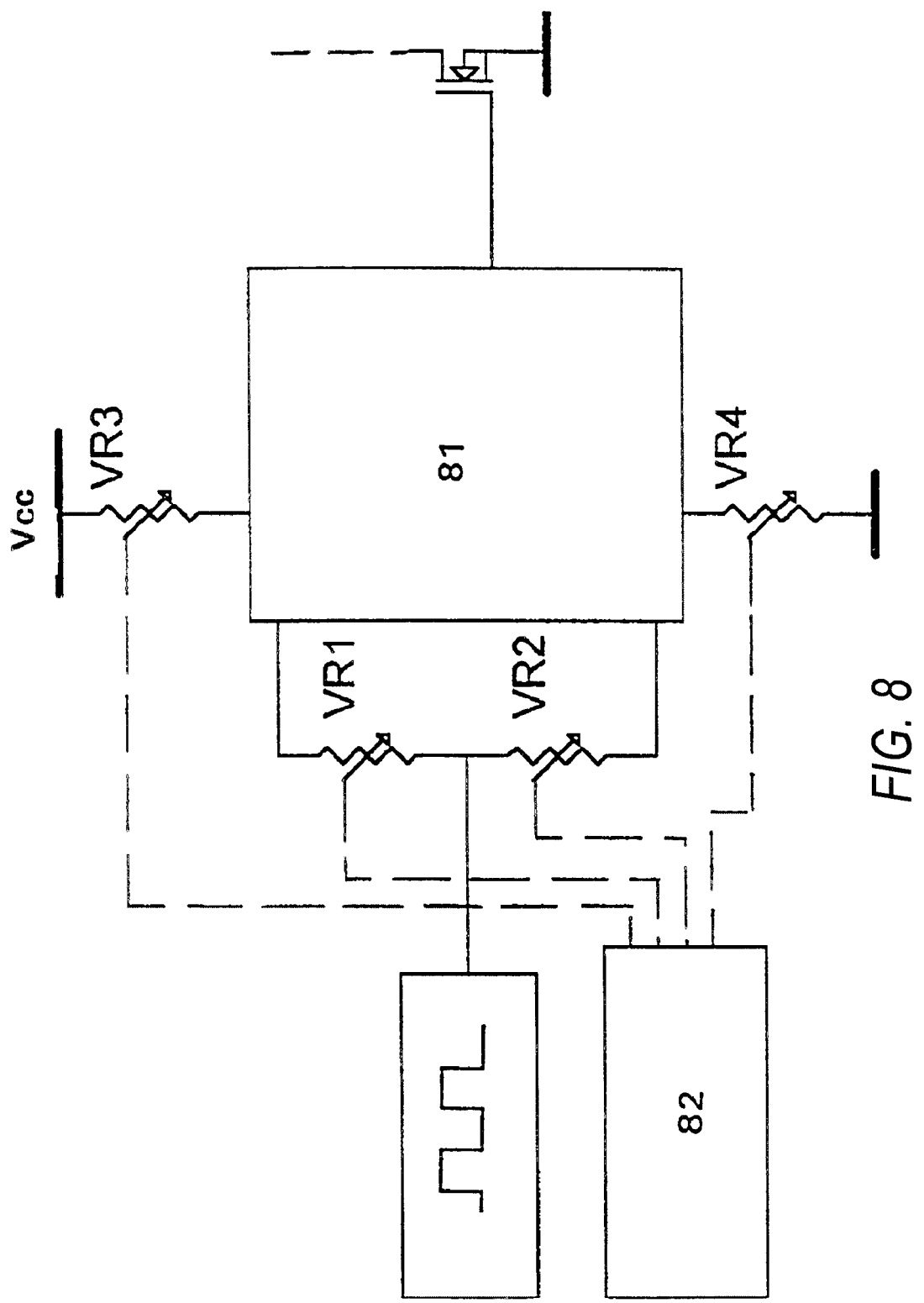
FIG. 8: is a block diagram of the microprocessor control of the gate drive circuit shown in FIG. 7.

FIG. 8 shows a block diagram of the gate drive circuit shown in FIG. 7 where the four control elements, VR1, VR2, VR3 and VR4, have been shown separately outside the gate control block 81. Each of the control elements, VR1, VR2, VR3 and VR4, consist of a variable resistance device with a digital serial control link (a digital Potentiometer) to a micro-controller 82, or similar. The micro-controller 82 with supporting memory and program code (not shown) may modify the four control parameters, VR1, VR2, VR3 and VR4, and hence the EMI and switching losses of the converter.

The following is given, by way of example only, to show the improvements in switching of insulated gate semiconductors given by the invention.

EXAMPLE 1

Voltage Switching Time Improvement

Figure 5A:
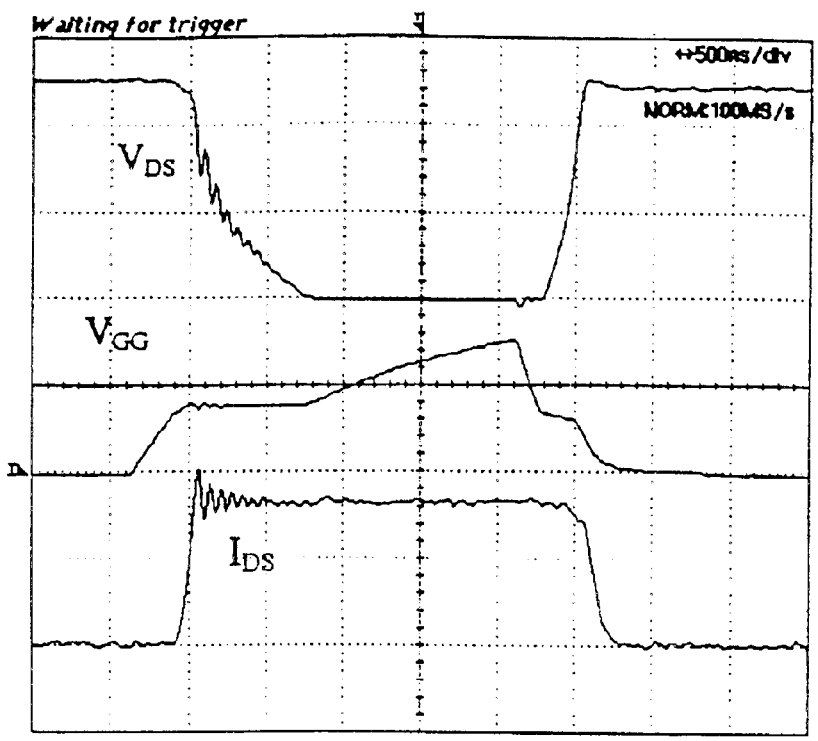
FIG. 5a: is a graphic representation of the drain voltage, gate voltage and drain current waveforms for known gate drives.
Figure 5B:
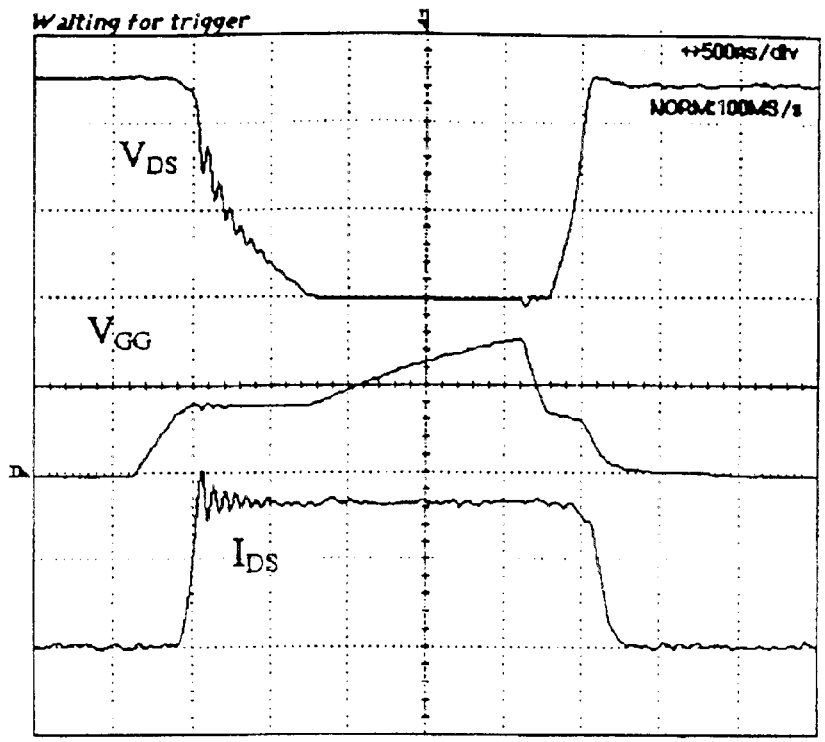

Referring to FIG. 5, the above circuit of FIG. 3 was trialled and the results are presented graphically in FIG. 5. The graph for a driver of known type (FIG. 1) is shown in FIG. 5a. The graph of the analog circuit of the invention is shown in FIG. 5b. The voltage drain $V_D$, gate voltage $V_{GS}$, and drain current $I_D$ waveforms are shown in both graphs. The variables and controls are as set out in Table 1. In Example 1 di/dt is the same for both the known circuit (FIG. 1) and the analog circuit of the invention.

TABLE 1

| | Variables | | | | | Controls | | | |
|---|---|---|---|---|---|---|---|---|---|
| | R$_{gon}$ Ω | R$_{goff}$ Ω | T$_{f(VDS)}$ (nS) | (di/dt)$_{on}$ (A/uS) | T$_{f(VDS)}$ (nS) | (di/dt)$_{off}$ (A/uS) | Current Amplitude | Pulse frequency | Duty Cycle |
| Conventional | 220 | 5 | 600 | 19.5 | 180 | 10 | 1.7 A | 100 KHz | 25% |
| Invention | 1R@1A | 1R@1A | 100 | 18 | 140 | 10 | 1.7 A | 100 KHz | 25% |

The analog circuits of the preferred embodiment includes a driver which is able to control the voltage ramp on the gate during turn-on. This enables control of the current slope and the EMI, while retaining a low output impedance. In this example, the effectiveness of the driver is not limited by output impedance (1 ohm), but by the current limit of the linear buffer.

EXAMPLE 2

EMI Improvement for Turn-on

Figure 6:
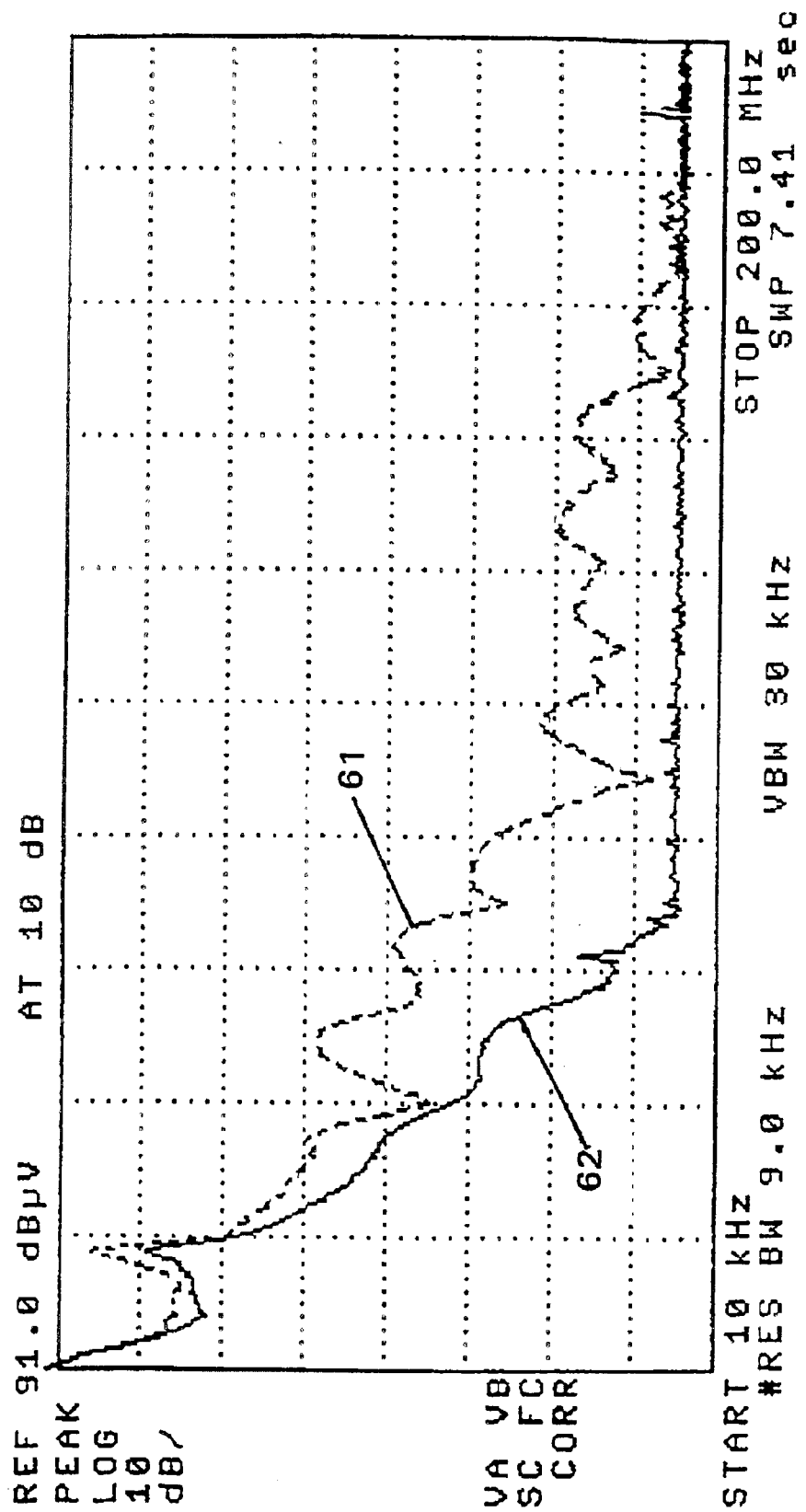
FIG. 6: is a graphic representation of the near-field radiated emission measurements of the prior art and that resulting from the turn-on circuits of the present invention.

Referring to FIG. 6, a graphical representation of the near-field radiated emissions of the known driver (FIG. 1) and of the circuitry of the preferred embodiment, are thereshown for the same voltage switching times. The parameters are as set out below in Table 2.

TABLE 2

| | Variables | | | | | Controls | | | |
|---|---|---|---|---|---|---|---|---|---|
| | R$_{gon}$ Ω | R$_{goff}$ Ω | (di/dt)$_{on}$ (A/uS) | T$_{f(VDS)}$ (nS) | T$_{r(VDS)}$ (nS) | (di/dt)$_{off}$ (A/uS) | Current Amplitude | Pulse frequency | Duty Cycle |
| Conventional | 34 | 5 | 38 | 100 | 180 | 10 | 2 A | 100 KHz | 30% |
| Analog | 1R@1A | 1R@1A | 18 | 100 | 140 | 10 | 2 A | 100 KHz | 30% |

FIG. 6 graphs the frequency spectrum obtained using an EMC analyser. The graph for the known, conventional driver is the line 61 and graph of the driver in accordance with the present invention is the line 62. The full improvement cannot be seen as the emission level from the invention reaches the noise floor of the measuring equipment before the conventional drive.

The above describes a preferred embodiment of the circuit for switch-on and is applicable to both MOSFETs and IGBTs.

Turn-Off

The circuit of FIG. 4 achieves similar improvements during turn-off as those shown for turn-on.

This applies fully to MOSFETs, but only to IGBTs during the miller effect and power mos phases. The dv$_{ds}$/dt can be controlled to a set value to ensure that the manufacturer's maximum values are not exceeded, thereby avoiding SCR latch-up and drain over-voltage. This is normally achieved using a minimum value of R$_{goff}$, thereby endangering erroneous and spurious turn-on of the device during turn-off.

Aspects of the present invention have been described by way of example only and it should be appreciated that the modifications and additions may be made thereto without departing from the scope thereof.

What is claimed is:

1. A drive circuit for driving a semiconductor device, comprising:
   a low output impedance amplifier having an input node and an output node for providing a gate drive signal;
   a signal generator having an input node for receiving gate drive commands and an output node connected to the input node of the amplifier; and
   a feedback loop for sensing a charge or discharge current of gate capacitances of the semiconductor device when driven by the output node of the charge or discharge current of gate capacitances of the semiconductor device to modify signals output from the signal generator, thereby modifying the gate drive signal.

2. The drive circuit of claim 1 wherein the feedback signal is proportional to the rate of charge or discharge of gate capacitances of the semiconductor device.

3. The drive circuit of claim 2, wherein, during turn on or turn off, the feedback loop maintains the rate of charge or discharge of gate capacitances of the semiconductor device at a first substantially constant level outside the Miller region and maintains the rate of charge or discharge of gate capacitances of the semiconductor device at a second substantially constant level, different from the first level, within the Miller region.

4. The drive circuit of claim 1, wherein the signal generator generates a ramp function in response to gate drive commands and generates an output signal at the output node of the signal generator based on the ramp function and the feedback signal.

5. The drive circuit of claim 1, wherein the feedback loop contains one or more current mirror which supplies the feedback signal proportional to the charge or discharge current of gate capacitances.

6. The drive circuit of claim 5, wherein the feedback loop includes a pair of current mirrors which respectively sense the rate of charge and discharge of gate capacitances.

7. The drive circuit of claim 5, further comprising variable elements to control the rate of change of signals output by the signal generator.

8. The drive circuit of claim 7, wherein a variable element is operable to control the slope of a ramp function generated by the signal generator during turn on of the semiconductor device.

9. The drive circuit of claim 7, wherein a variable element is operable to control the slope of a ramp function generated by the signal generator during turn off of the semiconductor device.

10. The drive circuit of claim 1, further comprising a variable element for adjusting the gain of the feedback signal during turn on of the semiconductor device.

11. The drive circuit of claim 10, wherein the variable element is a variable resistor.

12. The drive circuit of claim 1, further comprising a variable element to adjust the gain of the feedback signal during turn off of the semiconductor device.

13. The drive circuit of claim 12, wherein the variable element is a variable resistor.

14. The drive circuit of claim 8, further comprising a controller which adjusts the variable element.

15. The drive circuit of claim 9, further comprising a controller which adjusts the variable element.

16. The drive circuit of claim 10, further comprising a controller which adjusts the variable element.

17. The drive circuit of claim 12, further comprising a controller which adjusts the variable element.

18. A combination, comprising the drive circuit of claim 1 and a semiconductor device wherein the output node of the amplifier is connected to the gate of the semiconductor device.

19. The combination of claim 18, wherein the semiconductor device is a MOSFET.

20. The combination of claim 18, wherein the semiconductor device is an IBGT.

21. A method of driving an insulated gate semiconductor device comprising the steps of:

providing a gate drive signal to turn on or off the semiconductor device;

charging or discharging during gate turn on or off, respectively, a gate capacitance of the semiconductor device at a first substantially constant rate outside the Miller region; and charging or discharging during gate turn on or off, respectively, a gate capacitance of the semiconductor device at a second substantially constant rate, different from the first rate, within the Miller region; wherein the rate of charge or discharge of the gate capacitances of the semiconductor device is measured, and the gate drive signal driving the semiconductor device is related to a ramp function and a feedback signal related to a charge or discharge current of the gate capacitance.

22. The method of claim 21, wherein the rate of change of the ramp function is different for turning the gate on and turning the gate off.

23. The method of claim 21, wherein the substantially constant rates are different for gate turn on and gate turn off.

24. The method of claim 21, wherein the magnitude of the feedback signal is adjusted for different phases of switching of the semiconductor device.

* * * * *